United States Patent [19]

Elliott et al.

[11]  4,381,420
[45]  Apr. 26, 1983

[54] MULTI-CONDUCTOR FLAT CABLE

[75] Inventors: William A. Elliott, Reynoldsburg; Thomas J. Taylor, Gahanna, both of Ohio

[73] Assignee: Western Electric Company, Inc., New York, N.Y.

[21] Appl. No.: 298,217

[22] Filed: Aug. 31, 1981

Related U.S. Application Data

[62] Division of Ser. No. 106,599, Dec. 26, 1979, Pat. No. 4,310,365.

[51] Int. Cl.³ .............................................. H01B 7/08
[52] U.S. Cl. ........................................ 174/34; 174/32; 174/36; 174/117 A; 174/117 FF
[58] Field of Search ............... 174/32, 34, 36, 117 FF, 174/117 PC, 117 A

[56] References Cited

U.S. PATENT DOCUMENTS

| | | | |
|---|---|---|---|
| 3,239,916 | 3/1966 | Love | 174/117 A |
| 3,244,795 | 4/1966 | Latimer | 174/117 PC X |
| 3,481,802 | 12/1969 | Marcell | 174/117 X |
| 3,524,921 | 8/1970 | Wolf | 174/117 FF X |
| 3,703,604 | 11/1972 | Henschen | 174/117 FF X |
| 3,764,727 | 10/1973 | Balde | 174/117 FF X |
| 4,130,723 | 12/1978 | Wakeling | 174/117 PC X |
| 4,149,026 | 4/1979 | Fritz et al. | 174/117 FF X |

FOREIGN PATENT DOCUMENTS

| | | | |
|---|---|---|---|
| 1034170 | 5/1955 | France | 174/32 |
| 390227 | 4/1933 | United Kingdom | 174/32 |
| 1086823 | 10/1967 | United Kingdom | . |

Primary Examiner—R. R. Kucia
Attorney, Agent, or Firm—R. P. Miller; K. R. Bergum

[57]  ABSTRACT

Several flat cable embodiments (10, 10', 10'', 10''', 10'''') are disclosed, as are methods and apparatus (30) for the selective manufacture and connectorization of same. In accordance with one preferred flat cable embodiment (10), adapted for telephone under carpet applications, two precisely offset arrays of rectangularly shaped conductors (13, 14) are separated by a center film (16), with each array being adhesively bonded through an associated adhesive coating (21 or 22) to only the respectively adjacent one of two outer films (18 or 19). The laminating apparatus (30) includes a first pair of laminating rollers (31, 32), one (31) being both internally and externally heated, and having a smooth peripheral surface formed of a layer (68) of resilient material, the other (32) having a steel peripheral surface formed with a plurality of specially dimensioned conductor-receiving grooves (72), and a second pair of finishing rollers (37, 38), each being unheated and having a smooth, peripheral surface formed of a layer (37a or 38a) of resilient material. It has been found that by utilizing a center film (16) with no adhesive coating initially on either side thereof, and the specially constructed laminating apparatus (30), when used in conjunction with properly chosen laminating pressures, temperatures and feed rate, the resultant fabricated cable (10) exhibits excellent bond strength, and consistently and precisely maintained conductor spacings.

In accordance with another aspect of the invention, isolating strips (28, 29) are at least lightly secured on opposite sides of, and extend transversely across, the center film (16) at predetermined spaced terminating points therealong so as to facilitate the termination of the cable (FIGS. 8–12), and the subsequent connectorization of the terminated conductor ends (13a, 14a) thereof to a connector (25).

31 Claims, 12 Drawing Figures

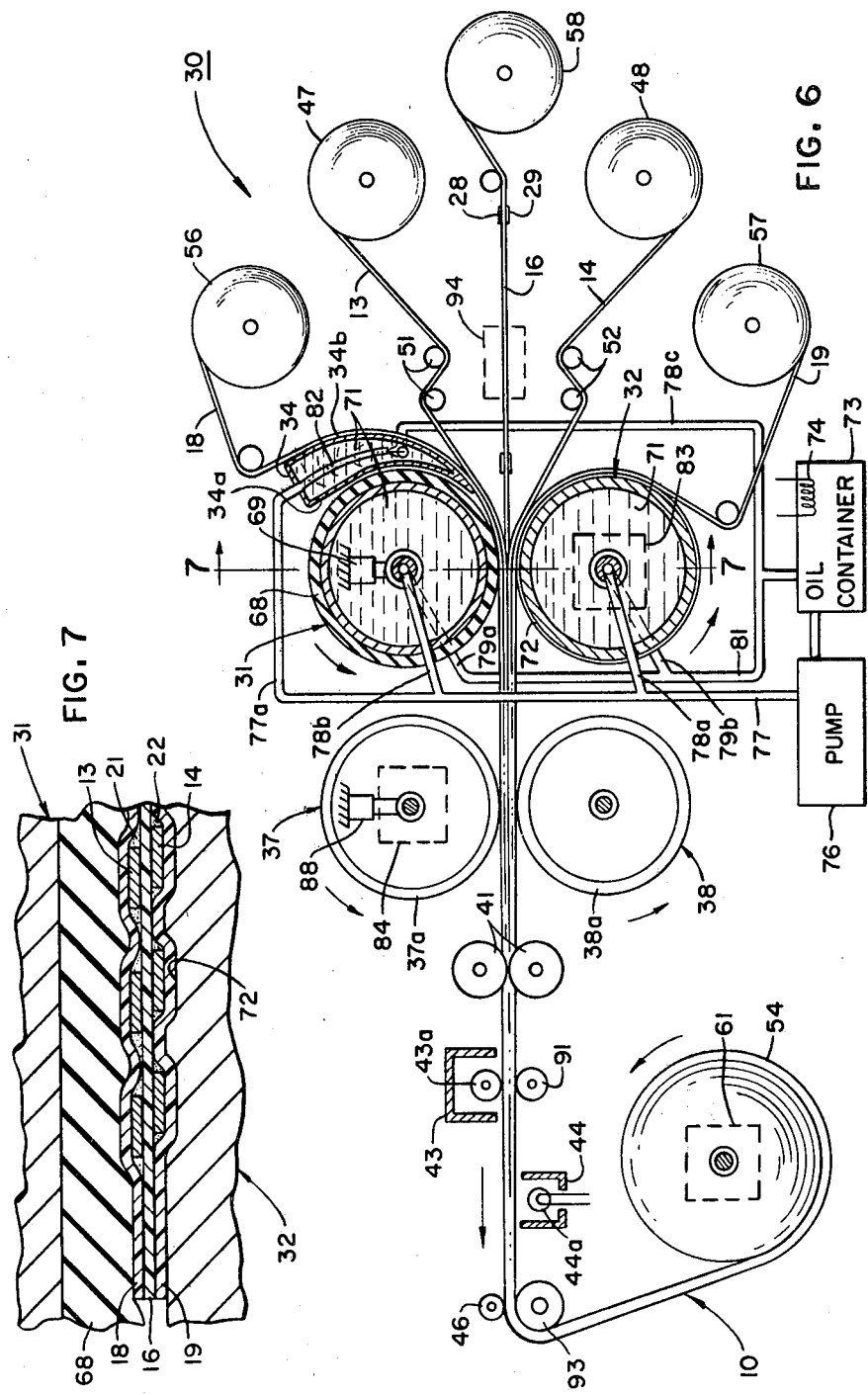

MULTI-CONDUCTOR FLAT CABLE

This is a division of application Ser. No. 106,599 filed Dec. 26, 1979 now U.S. Pat. No. 4,310,365.

FIELD OF THE INVENTION

This invention relates to telecommunications cable and, in particular, to multi-conductor flat cable.

BACKGROUND OF THE INVENTION

Flat flexible cable is finding ever increasing use in the telecommunications industry, and in such applications it is important that such cable exhibit extremely high cross-talk rejection, be of minimum thickness, and be capable of being folded back upon itself, so as to be applicable for telephone under-carpet cable applications, one such type being known as TUCC ® flat cable (a registered trademark of the Western Electric Company).

Flat cable, particularly of the 25 pair type designed for telephone system wiring, has taken a number of different forms heretofore, particularly in order to reduce crosstalk to tolerable levels. One of the earliest forms of such cable was comprised of a woven ribbon of twisted pair conductors. Disadvantageously, such cable was relatively thick (on the order of 0.080 inch), and when folded back upon itself so as to allow the cable to change direction when laid under carpet, for example, produced intolerable bumps that were found objectional from even an esthetic standpoint.

Another approach taken to reduce troublesome crosstalk in flat cable heretofore has involved forming so-called pseudo-twists (or crossovers) at predetermined spaced intervals therealong. In the latter type of cable, the conductors are normally initially fabricated along a common plane, with the zig-zag patterns of the respective conductors being spaced apart and arranged relative to each other in distinct groups so that when the fabricated cable is folded back upon itself in the longitudinal direction, the then respectively associated pairs of overlying-underlying conductors in the two groups effectively cross-over each other in a pseudo-twist manner. Unfortunately, when such a once folded cable is again folded back upon itself to effect bends therealong, it too exhibits undesirable thickness, particularly in the areas of the bends when required in under-carpet applications. Moreover, it has also been found quite difficult to manufacture the latter type of flat cable with crosstalk losses in excess of 100 db, particularly in end use lengths greater than 10 to 15 feet.

The criticality of crosstalk in telephone system wiring may perhaps be most readily appreciated when it is realized that the human ear can detect and interpret voice information at signal levels of nearly 100 db-five orders of magnitude down from, or only 0.001 percent of, the desired voice signal. In contradistinction, the crosstalk rejection requirements for flat cable used in computers, as well as in other digital systems, is far less demanding. For example, in such applications, the digital hardware can typically ignore up to one percent crosstalk (20 db loss). It is thus seen that flat cable when used in telephone voice applications must be 100 times more effective with respect to signal crosstalk rejection than when used in digital transmission applications.

Other attempts to reduce crosstalk in flat cable, particularly when the conductors are in overlying-underlying arrays, have involved the use of metallic shields, specially constructed and positioned screens, that separate groups or pairs of conductors, and ground planes. The purpose of such auxiliary members, of course, is to establish desirable capacitive-decoupling electric and magnetic field boundaries about either pairs or groups of conductors within the cable. While such flat cables generally exhibit excellent crosstalk rejection characteristics, they disadvantageously are likewise relatively thick, often are quite inflexible, and are costly to manufacture.

Still another approach taken to reduce crosstalk heretofore has been to vary the spacing between either adjacent conductors forming a given pair, or the spacings between pairs, while lying in a common plane. In many telephone wiring applications, where 25 conductor pairs are generally desired, such cables must necessarily be considerably wider than when the conductors are arranged in two overlying/underlying arrays, with only 25 conductors in each array.

As a result of the aforementioned crosstalk, dimensional and cost problems involved in the manufacture of flat cable for telephone applications heretofore, a completely different approach to attacking these problems evolved in the design of a cable wherein two peculiarly aligned, and precisely offset, overlying/underlying arrays of conductors are fabricated in a common insulative medium, such as in an extruded plastic carrier or, in separate flat cables which are thereafter bonded together or, more preferably, are interleaved and laminated between three plastic films.

Considered more specifically, it has been found in such a cable that capacitive decoupling, which gives rise to a very significant reduction in cross talk, can be substantially completely effected provided adjacent conductor pairs therein are spaced and spatially arranged to satisfy the following so-called geometric decoupling equality:

$$d_{13}\, d_{24} = d_{14}\, d_{23} \tag{1}$$

where the subscripts 1 and 2 represent the conductors of the first conductor pair, and the subscripts 3 and 4 represent the conductors of the second pair.

While it can be shown mathematically that the standard "quad" and "Tee" configurations most ideally satisfy the above decoupling equality, with certain assumptions, other quadrilateral geometric configurations, such as the parallelogram, equilateral trapezoid, and general quadrilateral, can all be shown to at least substantially satisfy the above decoupling equality. However, only the parallelogram configuration is of primary concern herein, because it advantageously allows two overlying/underlying arrays of conductors to be much more closely spaced than in the cae of a true "quad", or square geometry. In addition, a parallelogram configuration of adjacent conductor pairs advantageously exhibits an "open" decoupled characteristic, i.e., the decoupling locus thereof, which can be readily derived algebraically, is such that any number of adjacent decoupled conductor pairs can be employed in a multi-pair, multi-arrayed flat cable.

For purposes of this invention, it will suffice to simply state that in a flat cable of the type in question, it has been found that crosstalk is most effectively minimized when a family of parallologrrams are chosen that not only satisfy the aforementioned decoupling equality ($d_{13}\, d_{24} = d_{14}\, d_{23}$), but further satisfy the following decoupling locus equation therefor:

$$X = (2\cos 2\alpha)^{\frac{1}{2}}, \quad (2)$$

where $\alpha$ is the skew angle, i.e., the acute angle between adjacent sides of the parallelogram, and $X=2b/a$, where $2b$ is the length of each side of one pair of parallel sides and $a$ is the length of each side of the other pair of parallel sides. The angle $\alpha$ approaches $\pi/4$ as the vertical spacing between conductors becomes very close, or conversely, as the pair spacing increases.

It can be shown from a calculated plot of Near End Crosstalk (NEXT) versus conductor offset, that for a skew angle $\alpha$ close to $\pi/4$, and a vertical spacing between the conductors in each pair of approximately 0.004 inch, for example, that the expected loss peak will occur for an offset approximately equal to 0.012 inch. The particular offset required in any given cable of the type in question will depend, of course, on not only the thickness and dielectric constant of the material chosen to separate the upper and lower arrays of conductors, but on the cross-sectional configuration of the latter. As such, it is appreciated that in actual cable manufacture, less than perfect dielectric homogeneties and boundaries will selectively negate the realization of absolute zero crosstalk in any practical flat cable embodiment. Nevertheless, a flat cable of the type of concern herein is capable of producing crosstalk loss in excess of 120 db for cable lengths of 35 feet or more.

For a more detailed theoretical discussion of such a unique cable, reference is made to an article entitled "Geometrically Decoupled Balanced Pairs", by Mr. D. P. Woodard, of Bell Telephone Laboratories, presented at the proceedings of the International Wire and Cable Symposium, November 1978.

In connection with the manufacture of one particular form of the last mentioned type of cable for use in telephone under-carpet applications, wherein 25 pairs of conductors are arranged such that adjacent pairs form a parallelogram configuration, and wherein the upper and lower conductors are laminated between a common double adhesive-backed center film, and respectively associated adhesive-backed outer films, a very serious problem has arisen in maintaining not only the spacing between conductors in each array, but the very critical offset between the respectively associated conductors in the two arrays, within stringent limits.

More specifically, it was found that the requisite offset between the two arrays of conductors tended to cause the respectively associated pairs of overlying-/underlying conductors to randomly shift laterally while the conductors and films were fed through a pair of laminating rollers during the fabrication of the cable. Unfortunately, it was further found that even extremely small lateral displacements of the conductors, particularly with respect to the offset dimension, could not be tolerated in a cable designed for telephone voice transmission applications. The criticality of the conductor offset dimension can perhaps best be appreciated by the fact that in one particular type of flat cable, where the nominal offset dimension is 0.010 inch, even several lateral conductor deviations greater than ±0.002 inch in a given length of cable as short as 10 feet, can produce a drastic decrease in crosstalk loss from a range from 110–120 db down to an unacceptacle level well under 100 db.

In an effort to reduce the conductor spacing deviations in question, a number of different types of conventional flat cable laminating apparatus, and process techniques, have been tried, but with no success. In this regard, different combinations of laminating roller assemblies, in particular, were tried wherein the rollers, for example, comprised either two steel or one steel and one rubber-covered roller, either selectively or both internally heated, and heated in different ways, for laminating two offset arrays of ribbon-shaped conductors between three polyester plastic films, wherein the two outer films were adhesive-backed on the inner side, and the center film was adhesive-backed on both sides. Such a combination of adhesive-backed films was considered important so as to achieve a reliable and high degree of bond strength, and very precisely positioned, permanently bonded and completely encapsulated conductors between the center and associated outer films. Concomitantly, the laminating temperature, pressure and feed rate employed were also varied over wide ranges, selectively, in attempts to maintain conductor spacing uniformity within the necessary stringent limits.

Unfortunately, however, it was found that no prior conventional laminating apparatus, nor any particular choice of laminating operating parameters employed in conjunction therewith, would consistently maintain the requisite conductor spacings and offset within an acceptable range of ± deviations and, particularly, while at the same time producing satisfactory bond strength between the three films of the composite cable. Indeed, not even a change in the type of plastic films employed, or changes in the thicknesses thereof, or in the composition or thicknesses of the adhesive coatings, proved beneficial in maintaining either the conductor spacing or offset within the required tolerances.

In addition to the aforementioned problems experienced heretofore in manufacturing a cable of the type of concern herein, another problem also arose with respect to terminating such a cable for connectorization. More specifically, because of the utilization of two arrays of conductors, with each laminated between an outer and center film, both adhesive-backed, the interposed conductors were firmly bonded to both films. As such, whenever short terminating segments of the outer films were removed, such as through the use of a conventional material grinding or abraiding operation, so as to expose the outer surfaces of the terminated conductors, they still remained firmly secured to the center film. This, of course, made complete insulation stripping of the terminating conductor ends quite difficult and time consuming.

For similar reasons, the prior use of conductor masking or separating tapes, disposed transversely across, and on opposite sides of, a single array of conductors, so as to facilitate the separation of two opposite side cover films from the conductors, likewise would not prove effective in terminating the flat cable in question for connectorization. More specifically, in accordance with the prior disclosed uses of such tapes, they would not be effective in separating two underlying/overlying arrays of conductors from a normally inaccessible center film (as distinguished from cover films) bonded to both arrays of conductors.

W. B. Fritz et al. U.S. Pat. No. 4,149,026 discloses another technique employed heretofore to separate the terminating ends of two underlying/overlying arrays of conductors when interleaved and laminated between two respectively associated adhesive backed outer carrier members and an inner adhesive member. As disclosed in that reference, the inner adhesive member is dimensioned such that it does not extend to both marginal edges of the outer carrier members. One longitudinally disposed edge of each carrier member is thus readily accessible for peeling the conductors bonded thereto from the inner member, provided the conductors are initially bonded more firmly to the carrier members than to the inner adhesive member. Disadvantageously, such a cable construction does not allow the two arrays of conductors to be completely hermetically sealed between the outer carrier members, as is desired, if not required, in many flat cable wiring applications.

In view of the foregoing, there has been an urgent need for an improved type of underlying/overlying multiconductor flat cable, and of a method and apparatus for the manufacture thereof, that will allow adjacent conductor pairs therein to be consistently spaced within extremely stringent limits, while positioned in the aforementioned, and advantageous, parallelogram type of geometric configuration, desired for high crosstalk rejection. A solution has also been sought for such an improved cable which at the same time will allow for the simplified termination and connectorization thereof.

SUMMARY OF THE INVENTION

It, therefore, is an object of the present invention to provide a flat, thin flexible cable, particularly adapted for low cost telephone under carpet applications, and which exhibits excellent and consistent crosstalk characteristics, and is readily fabricated and connectorized.

In accordance with the principles of the present invention, the above and other objects are realized in one preferred flat cable wherein two precisely offset arrays of rectangularly shaped conductors are separated by a center polyester film, with each array of conductors being adhesively bonded directly to only the adjacent inner surface of the associated one of two adhesive-backed outer films.

Considered more specifically, in accordance with several significant aspects of the invention, it has been found that by utilizing a combination of two peculiarly constructed and heated laminating rollers, and three proper chosen polyester films, with only the two outer films having an adhesive coating (of a predetermined type and thickness) on the inner facing surfaces thereof, together with a properly chosen laminating temperature, pressure and feed-through rate, the requisite conductor spacings and offset within the cable can be very reliably and consistently maintained during manufacture. In addition, the conductors advantageously remain permanently positioned and encapsulated between the respectively associated laminated films such that no lateral displacement thereof is possible after fabrication, even when the cable may be subsequently folded back on itself to effect any necessary bends when installed under carpets, or for any other purpose, in a telephone system wiring installation.

With respect to the pair of laminating rollers, it has been found very important that one roller be of steel, formed with a plurality of specially dimensioned conductor-receiving grooves in the cylindrical peripheral surface thereof, and internally heated. The other roller, also of steel, has a smooth, resilient, cylindrical peripheral surface, such as formed by a layer of silicone rubber, and is both internally and externally heated in a unique manner.

With respect to the three laminating films, it has been found to be very important, particularly when the geometric configuration of the multi-arrayed conductors interleaved therebetween involves an offset, that only the outer films have an adhesive coating thereon, with the center film being bare, and preferably of polyester material, such as Mylar ® plastic film (registered trademark of the E. I. duPont de Nemours Co.). The outer films are also preferably of polyester material, such as Mylar plastic film, with heat-activated, flame retardant polyester adhesive coatings on the inner surfaces thereof, as fabricated.

In connection with the heating of the laminating rollers, it has also been found very important to utilize a peculiarly configured heated shoe not only to externally heat an arcuate portion of the rubber-covered laminating roller, but the associated array of conductors, and outer film, immediately before they pass through the nip of the laminating rollers.

In accordance with another aspect of the invention, the aforementioned cable attributes are further enhanced by feeding the laminated cable, with the plastic films still in a somewhat pliable state, through the nip of a second pair of unheated finishing rollers, each having a smooth, resilient, cylindrical peripheral surface, such as formed by a layer of silicone rubber. The finishing rollers have been found to reduce some of the tension otherwise exerted on the cable while in a somewhat pliable state, as a result of being frictionally fed through the nip of the first pair of laminating rollers. The finishing rollers further function to eliminate any possible air pockets in the cable, and to force the still very soft adhesive into any possible remaining voids that may exist between adjacent conductors in the same array.

In accordance with still another aspect of the present invention, termination and connectorization of a preferred embodiment of the flat cable is greatly facilitated by preferably lightly or permanently bonding a spaced array of isolating strips, such as of plastic material, on each side of, and extending transversely across, the bare center film, in aligned pairs, prior to the laminating operation to fabricate the cable. The isolating strips are preferably positioned at predetermined possible spaced cable termination points, for example, at five, ten or fifteen foot intervals along the cable. Such isolating strips may be of a material, or have properly chosen double-backed adhesive coatings thereon, that will cause the strips to either bond or not bond to the respectively associated outer films, and when bonded thereto, with controlled adhesion relative to the center film. As such, the terminating ends of the conductors may be selectively stripped from the center film, and/or the respectively associated outer films, as desired, or required, to facilitate connectorization of the terminated conductor ends to either solder or solderless type connectors in a simplified and reliable manner.

DETAILED DESCRIPTION OF THE DRAWINGS

FIG. 1 is a fragmentary, perspective view of a flat flexible cable wherein two offset arrays of conductors, separated by a thin, non-adhesive backed center plastic film, are laminated between opposite sides of the center film and two respectively associated outer films, together with two aligned and center film-separated arrays of isolating strips, in accordance with one preferred illustrative embodiment of the invention;

FIG. 6 is a schematic view of one preferred embodiment of the apparatus employed to fabricate the cable depicted in FIG. 1, in accordance with the principles of the present invention;

FIG. 7 is an enlarged, detailed, fragmentary sectional front view of the laminating rollers in the apparatus of FIG. 6, taken along the line 7—7 of that FIG., together with the center and outer laminating films, and the two arrays of conductors, while positioned in the nip defined between the two rollers;

Figure 1:
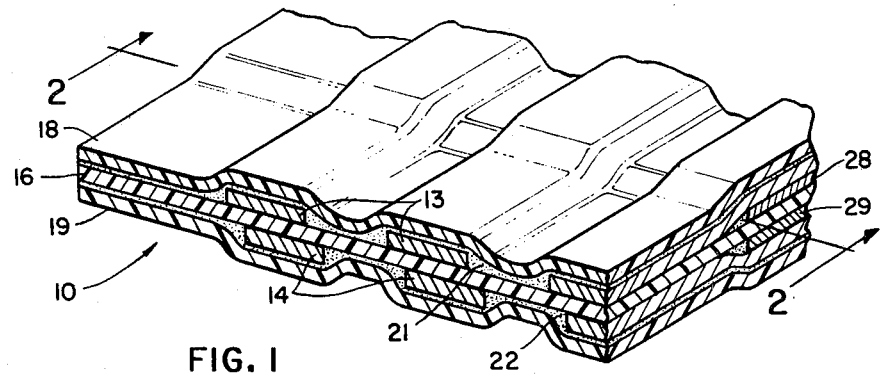
Figure 8:
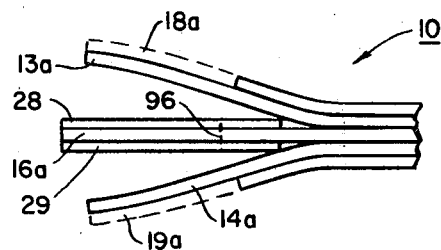
FIG. 8 is a fragmentary, side elevational view of a terminated end section of the flat cable of FIG. 1, with end portions of the outer films having been removed, and with each of the isolating strips remaining bonded to the center film, preparatory to the conductor ends being secured to either a solder or solderless type connector.
Figure 9:
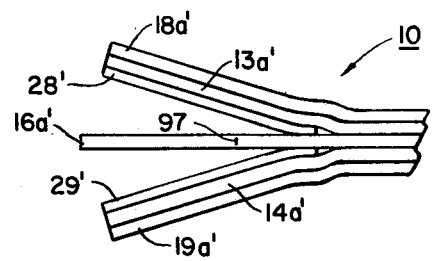
Figure 10:
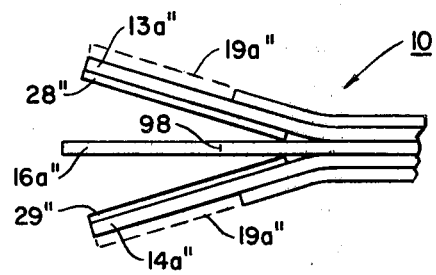

FIG. 9 is a fragmentary, side elevational view of a terminated end section of the flat cable of FIG. 1, wherein the conductor ends in each array remain laminated between the respectively associated outer film and isolating strip, with at least the major portion of the latter being separated from the center film, so as to allow connectorization of the conductors to an insulation displacement type conector;

FIG. 10 is a fragmentary, side elevational view of a flat cable similar to that of FIG. 9, but distinguishing therefrom by having the terminated end portions of the outer cable films removed from the conductors, as in FIG. 8, so as to expose the outer surfaces of the latter for connectorization to either solder or solderless type connectors, but with the isolating strips remaining bonded to the conductors rather than to the center film so as to facilitate conductor alignment during connectorization of the cable.

Figure 11:
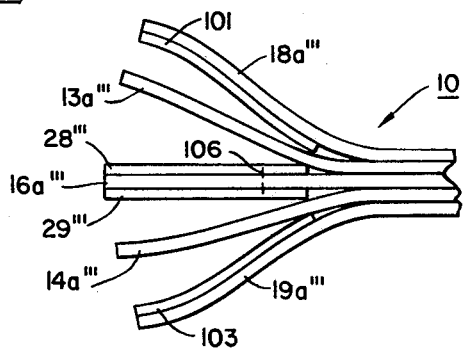
Figure 12:
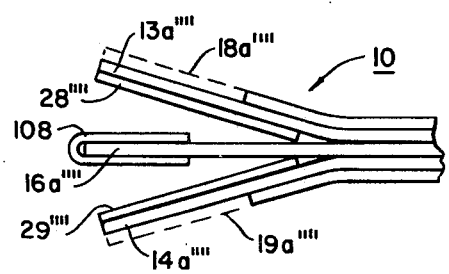

FIG. 11 is a fragmentary, side elevational view of an alternative flat cable embodiment wherein four isolating strips are initially laminated in an interleaved manner as part of a cable of the general type depicted in FIG. 1, so as to facilitate the complete stripping of the insulation manually from the conductor ends in preparation for their connectorization to either a solder or solderless type connector, and FIG. 12 is a fragmentary, side elevational view of a flat cable similar to that of FIG. 9, or optionally FIG. 10, but further including an insulative auxiliary spacing member bonded to opposite sides of the exposed forward end of the center film, upon termination of the cable, so as to provide greater dielectric material separation between the two arrays of terminated conductors, particularly desired if they are again compressed through the interposed isolating strips against the spacing member to facilitate insertion of the terminated cable end in a female type connector.

DETAILED DESCRIPTION OF THE INVENTION

Figure 2:
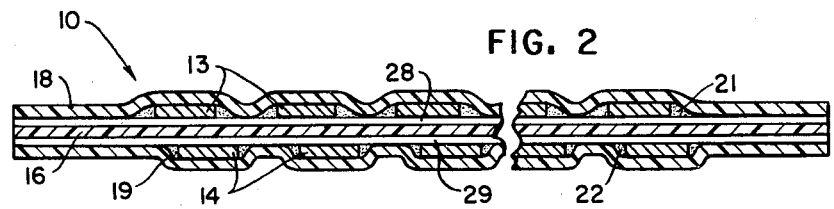
FIG. 2 is a fragmentary, detailed, cross-sectional view of the cable of FIG. 1, taken along the line 2—2 of that FIG., showing a pair of terminating isolating strips incorporated therein in greater detail.
Figure 3:
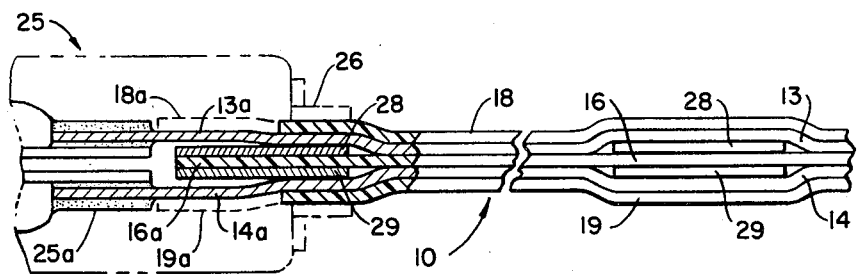
FIG. 3 is a side elevational view, partially in section, of a flat cable assembly wherein the cable of FIG. 1 has the terminated conductor ends stripped of insulation and solder-connected to respectively associated contacts of a connector.

With particular reference now to FIGS. 1-3, there is depicted a flat cable 10 adapted particularly for telephone under-carpet wiring applications. The cable is fabricated with two precisely offset arrays of flat, ribbon-like conductors 13, 14, separated by a center film 16, with each conductor array, and the exposed areas of the associated side of the center film, being adhesively bonded to the inner surface of the associated one of two outer films 18, 19, each having an adhesive coating, or backing 21, 22, respectively, on one major side thereof.

In accordance with one aspect of the invention, in order to manufacture the cable 10 with the requisite conductor spacings and offset maintained within exceedingly stringent limits, it has been found to be very important that the center film 16 initially be bare, i.e., have no adhesive coating or backing on either side thereof. As such, the conductors 13, 14, in each array are only directly bonded to the respectively associated outer films 18, 19, with opposite sides of the center film 16 being respectively bonded thereto only in the exposed, longitudinally extending areas defined between conductors of the associated overlying/underlying arrays, and along the co-extensive border regions.

In accordance with one one aspect of the invention, spaced pairs of non-conductive and aligned isolating strips 28, 29 are uniquely positioned between the center film 16 and the respectively associated arrays of conductors 13, 14. As will be described in greater detail hereinbelow, in connection with the methods and apparatus for fabricating and connectorizing the subject cable 10, the isolating strips 28, 29 are employed to facilitate the separation of the conductor ends from the center film 16 for cable termination and connectorization.

The center film 16 and outer films 18, 19 are preferably of polyester material, such as polyetheyelene terephthalate, one form sold under the aforementioned registered tradename Mylar plastic film. The adhesive backing on each of the outer films 18, 19 preferably comprises a heat-activated, flame retardant polyester material, with one preferred form of such an adhesive being available from the Sheldahl Company under the code name GT-340. The isolating strips are preferably of Teflon ® resin polymer plastic (registered tradename of the E. I. duPont de Nemours Company), with polyester adhesive backing on the side facing the center film.

Depending on the type of plastic material employed to form the isolating strips 28, 29, and the nature of the adhesive backing thereon, they may be either lightly or permanently bonded selectively to the center film 16, or to an associated outer film 18 (or 19), or to both, with different predetermined degrees of adhesion. Such selective bonding of the isolating strips advantageously makes it possible to effect different types of cable terminations and connectorizations, one such connection, to an illustrative connector 25, being depicted in FIG. 3, and described in greater detail hereinafter in connection with FIGS. 8-12.

With respect to typical structural dimensions of the various elements forming the composite cable 10, it will be appreciated that the thickness dimension of the center film 16, and of the outer films 18, 19, will depend to a great extent on the size and shape of the conductors 13, 14, as well as on the composition of both the films, and of the adhesive coatings applied to the outer films. In addition, a flat cable utilizing offset conductors arranged in the geometric configuration of primary concern herein, the thickness of the center film 16, for the reasons discussed above, is also dependent on the conductor offset dimension, or skew angle, required in order to optimize crosstalk loss in the cable.

With the significance of such factors being understood, the conductors would typically have a thickness in the range of 0.003 to 0.008 inch, a width in the range of 0.025 to 0.040 inch, and a center line-to-center line spacing of 0.080 to 0.090 inch, with the offset dimension normally being in a range of 0.002 to 0.008 inch, and the outer films 18, 19 would normally each have a thickness in the range of 0.002 to 0.005 inch, with an adhesive coating thereon having a thickness in the range of 0.001 to 0.005 inch.

By way of a more specific example of one preferred embodiment of the cable 10, wherein the conductors 13, 14 were of flat rolled, annealed copper, measuring approximately 0.006×0.033 inch in cross section, the offset between the two arrays of conductors measured approximately 0.010 inch, the center film 16 was of bare Mylar plastic film, measuring approximately 0.005 inch in thickness, and the two outer films 18, 19 were also of Myler plastic film, measuring approximately 0.003 inch in thickness, with the aforementioned type of polyester adhesive coatings 21, 22 on the outer films measuring approximately 0.003 inch in thickness, the cable exhibited very high crosstalk loss, in excess of 110 db in lengths up to 35 feet. Equally important is the fact that when using the cable laminating apparatus embodied herein, in conjunction with the specified processing temperatures, laminating pressures and feed rates described in detail hereinbelow, the critical conductor offset chosen of 0.010 inch, did not vary more than ±0.002 inch on either side thereof during cable fabrication, and the cable also exhibited excellent bond strength, evidenced by a peel force exceeding 8 pounds per inch between any two adjacent films.

As previously noted, the respectively associated conductors in the two arrays could be arranged in quadrilateral geometric configurations other than the parallelogram to effect a significant reduction in crosstalk. However, some of the other spatial conductor geometries would require a considerably greater vertical spacing between the two arrays of conductors, which normally is not desirable because of the resulting thickness of the cable. For that reason, in particular, it is very advantageous to fabricate the cable 10 in accordance with a prescribed family of parallelograms wherein the respectively associated conductors 13, 14 in each pair are offset by a critical dimension, the specific dimension being chosen to minimize the undesired capacitive coupling between adjacent pairs (inductive coupling normally being negligible).

Figure 4:
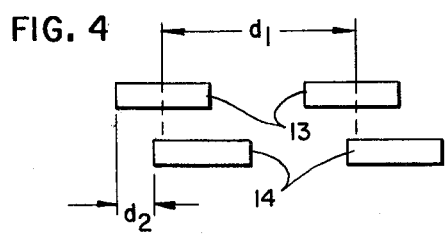
FIG. 4 is a schematic view illustrating in greater detail the offset relationship between the conductors in each of two adjacent pairs thereof in the cable of FIG. 1, which cable typically includes 25 such pairs.

The desired parallelogram-defined spatial relationship desired between two adjacent pairs of conductors in the cable 10 is illustrated in greater detail in FIG. 4, with the dimension $d_1$ and $d_2$ indicating the center line-to-center line spacing between adjacent conductors in a common array, and the offset spacing between conductors of each pair, respectively.

Figure 5:
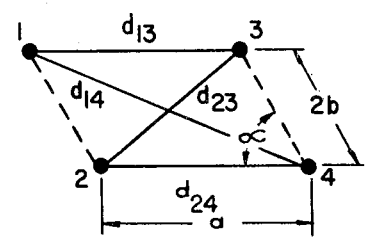
FIG. 5 is a schematic representation of the geometric parallelogram relationship established between the conductors of two adjacent pairs, arranged as depicted in FIG. 4, together with the designated spacings therebetween that are used to define a significant capacitive decoupling equality based on the spatial relationship of the conductors.

FIG. 5 further illustrates schematically the geometric relationship between the conductors of FIG. 4, with one pair of conductors being represented by the points designated 1 and 2, and the other pair of conductors being represented by the points designated 3 and 4. The significant distances between the various conductors involved in satisfying the geometric decoupling equality ($d_{13}\,d_{24}=d_{14}\,d_{23}$), discussed hereinabove and identified as equation (1), are correspondingly identified in FIG. 5. Also shown are the particular sides of the parallelogram involved in satisfying the aforementioned locus equation (2) for the desired family of parallelograms, namely, $X=(2\cos 2\alpha)^{\frac{1}{2}}$, where $\alpha$ is the skew angle, and $X=2b/a$. As will be recalled, and as identified in FIG. 5, $2b$ is the length of each side of one pair of parallel sides, and $a$ is the length of each side of the other pair of parallel sides of a desired conductor-defined form of parallelogram. It can be shown mathematically that the angle $\alpha$ approximates $\pi/4$ as the vertical spacing between the conductor arrays advantageously becomes very close. From a calculated plot of Near End Crosstalk (NEXT) loss versus conductor offset, for a skew angle close to $\pi/4$, and a vertical spacing between the conductors in each pair of approximately 0.005 inch, as in the one preferred embodiment of the cable 10 described above, the expected peak in crosstalk loss will occur when the offset approximately equals 0.010 inch.

It should be appreciated, however, that variations in conductor shapes and dielectric inhomogeneties and boundaries will slightly alter the actual offset that should be used in any given cable. In addition, such variations will prevent the attainment of zero crosstalk between adjacent conductor pairs because of less than perfect electric and magnetic decoupling being achievable simultaneously in practice. Nevertheless, excellent crosstalk rejection has been made possible by arranging two overlying/underlying arrays of flat cable conductors in accordance with the geometrically decoupled quadrilateral configurations defined above and, in particular, the parallelogram configuration, analyzed and described in the aforementioned article by D. P. Woodard. In that regard, the conductors have been found to be most reliably and precisely positioned in the desired parallelogram configuration when the cable of which they form a part is fabricated in accordance with the principles of the present invention.

Attention is now directed to FIG. 6, which schematically illustrates one preferred embodiment of a laminating apparatus 30 for manufacturing the multi-conductor arrayed flat cable 10 depicted in FIG. 1, and described in detail hereinabove. The laminating apparatus includes a pair of heated laminating rollers 31, 32, a specially constructed heated shoe 34, and a pair of unheated forming rollers 37, 38. Following the latter rollers are a cable slitter 41, a counter 43, a light box conductor gauging platform 44 and a printer 46. The latter three structural elements are optional and only schematically shown, as they may be of a conventional type, and selectively used in practice.

Also associated with the laminating apparatus 30 are two conductor supply reels 47, 48 for the conductors 19, a film supply reel 58 for the center film 16, and a take-up reel 54, driven by a motor 61, shown only schematically, for the completely fabricated cable 10.

Considering now the laminating rollers 31, 32 in greater detail, the upper roller 31, internally heated, is preferably made of steel, with a smooth, resilient cylindrical peripheral surface, such as formed by a relatively thin outer layer 68 of silcone rubber. One preferred type of such rubber, in cylindrical form, may be purchased from the American Roller Co., and is characterized by having a resiliency of 60 Durometer, and an useable temperature limit of at least 400° F. It has been found that for manufacturing one preferred embodiment of the cable 10, the outer layer 68 of rubber may have a thickness in the range of 0.01 to 1.0 inch, however, a thickness of approximately 0.75 inch has been found most effective in attaining the bond strengths desired, while at the same time affording more accurate control over the conductor spacing and the associated offset during the fabrication of the cable. The roller 31 is controllably biased relative to the roller 32, such as pneumatically, as indicated symbolically by a double acting pneumatic cylinder 69.

Laminating roller 31, as well as roller 32, are both internally heated, preferably by a re-circulated supply of hot oil 71 fed into and out of oil retaining interior cavities of the rollers. The oil is initially heated to the desired temperature in a container 73, preferably having a suitable heater element 74 therein, depicted as of the filamentary type, and is then fed under pressure, by means of a pump 76, through a main conduit 77 and two conduit branches 78a and b to the interior cavities of the rollers 31, 32, respectively. The re-circulated oil is returned from the rollers to the heated container 73 through two respective conduit branches 79a and b and a main conduit 81. The container 73, heater element 74 and pump 76 may all be of conventional design. One preferred type of oil employed therewith is Mobiltherm No. 603, sold by the Mobil Oil Co.

While the oil may be supplied to the interior cavities of the rollers in a number of different ways, one preferred way, as schematically illustrated, is through the use of journaled rotating unions that form a part of the axial bearing assemblies of the rollers. The incoming oil may be simply fed into the roller cavities or, more preferably, sprayed outwardly toward the periphery of the rollers through an axially disposed conduit (not shown) having an array of spray orifices formed therein. The somewhat cooled excess oil is preferably returned from the rollers 31, 32 to the heated container through an overflow outlet port (not shown) associated with the rotating union forming a part of each roller. The significance of utilizing oil to internally heat the rollers 31, 32 is that it has been found to provide a very effective medium with which to accurately and uniformly establish a desired temperature on the peripheral surfaces of the rollers.

For manufacturing a cable 10 of the type embodied herein, the peripheral steel surface of the roller 31, i.e., at the interface with the rubber layer 68, is generally heated to a temperature in the range of 360° F. to 410° F., which establishes a temperature at the periphery of the rubber layer in the range of about 260° F. to 340° F.

The lower laminating roller 32, also preferably formed of steel, is internally heated by the aforementioned re-circulated hot oil 71 such that the cylindrical peripheral surface thereof also attains a temperature in the range of 360° F. to 410° F. With such laminating roller operating temperatures, and compressive force exerted on the three films 16, 18 and 19, and the two interleaved arrays of conductors, at the bias-controlled nip of the rollers, would normally be in a range of 100 to 500 psi, with the cable feed rate typically being in a range of 4 to 20 ft. per minute, in order to fabricate a cable with the desired physical and electrical characteristics described hereinabove. The reason for the seemingly wide range for the laminating pressures residues in the fact that it is very difficult to accurately measure the pressure exerted on the composite cable independently of the pressure also exerted between the rollers 31, 32. This follows from the fact that the rollers extend beyond opposite sides of the cable, and along such regions the peripheries of the rollers are also in biased, rotating contact with each other.

It should also be understood that the particular temperatures, pressures and feed rates associated with the bonding rollers 31, 32 will depend on a number of factors, such as the particular physical dimensions and compositions of the conductors, plastic films and adhesives employed in manufacturing a given flat cable in accordance with the principles of the present invention.

In order to consistently limit deviations on either side of the critical offset dimension, when having a desired nominal value of 0.010 inch, to within ±0.002 inch, in one preferred embodiment of the subject flat cable, it has also been found necessary to construct the lower laminating roller 32 with a laterally disposed array of conductor-receiving grooves 72 in the cylindrical peripheral surface thereof, as best seen in FIG. 7. These grooves are dimensioned to accommodate not only the width dimension of the lower array of conductors 14, but the thickness of the outer film 19 on either side of a nested conductor, and preferably some of the adhesive material 19a, upon all of these elements being heated, under pressure, while being advanced through the nip of the laminating rollers 31, 32. With respect to the film 19, a certain degree of shrinkage thereof, upon being heated, must also be taken into account in dimensioning the grooves 72. By way of example only, in one preferred embodiment of the flat cable 10 having the specific structural dimensions set forth above in connection with a description of the cable per se, each groove measured approximately 0.041×0.010 inch in width and depth, respectively.

While both laminating rollers 31, 32 could be directly driven, it is preferred that only the steel roller 32 be directly driven, such as by a motor 83, shown only schematically in FIG. 6. With the upper roller 31 then being indirectly driven by only frictional engagement with the advancing composite cable, there is no problem of having to precisely match the peripheral speed of the two rollers, which can vary a small amount not only because of the resilient peripheral surface of the roller 31, but because of slight variations in the diameters of the two rollers as constructed.

Inasmuch as the rubber layer 68 on the upper roller 31 does not function very effectively as a heat conductor, it has been found necessary, as previously mentioned, to utilize the internally heated shoe 34, constructed with arcuate surfaces 34a, 34b. The former surface is formed with a radius of curvature that allows it to be positioned immediately adjacent an appreciable peripheral portion of the upper roller 31 in a region near the nip defined between the two rollers 31, 32. The arcuate surface 34b of the shoe is located so as to allow the non-adhesive backed side of the upper film 18 to pass thereover immediately prior to being fed through the nip of the laminating rollers. As configured, the heated shoe also preferably allows the upper array of conductors 13 to pass over a portion of the outer arcuate surface 34b just prior to being advanced through the nip of the rollers 31, 32. In fabricating a flat cable of the type of primary concern herein, the shoe 34 is preferably internally heated by the same heated oil 71 employed to heat the laminating rollers 31, 32, so as to likewise provide a temperature at the arcuate surfaces thereof typically in a range between 360° F. to 410° F. A spray tube 82 mounted within the shoe 34, and formed with a plurality of orifices, effectively sprays the inlet oil outwardly against the arcuate surfaces 34a, b of the shoe. The oil 71 is recirculated through the shoe 34 by means of a coupled extension 77a of the conduit 77, and a coupled outlet conduit branch 78c, the latter being coupled to the oil container 73 through the common conduit 81.

Downstream of the laminating rollers 31, 32 are the aforementioned unheated forming rollers 37, 38. Both of these latter rollers have smooth, cylindrical resilient peripheral surfaces, such as formed by layers 37a, 38a of the same type of silicone rubber employed in laminating roller 31. Such rubber layers may typically also have a thickness in the range of 0.01 to 1.0 inch, with 0.75 inch being preferred in the fabrication of one preferred embodiment of the cable 10. For that purpose, the roller 37 is controllably biased relative to the roller 38, such as pneumatically, as indicated symbolically by a double acting pneumatic cylinder 88, to exert a compressive force on the cable in the range of 50 to 500 psi.

As will be described in greater detail in connection with a description of the operation of the laminating apparatus 30, the rollers 37, 38 tend to minimize tensile forces otherwise exerted on the three films while in a somewhat pliable state, by the laminating rollers 31, 32, and further contribute to minimizing or eliminating any voids or air pockets that may possibly still remain in the cable after passing through the nip of the laminating rollers. As in the case with the laminating rollers 31, 32, only one of the rollers 37, 38 is preferably directly driven, such as the upper roller 37, coupled to a motor 84, shown only schematically in FIG. 6.

The aforementioned cable slitter 41 may be of conventional construction comprising, for example, a different pair of cutter wheels positioned on each side of the laminated cable so as to trim the latter to any desired finished width.

As previously mentioned, the counter 43, light box gauging platform 44 and printer 46 are all optional. The counter 43 when used may be of a conventional type including a contact roller 43a that rotatably engages the cable at a point preferably opposite an optional idler roller 91. Such a counter, of course, is used to accurately measure and provide a readout of the lineal running feet of the fabricated cable.

The light box conductor gauging platform 44, when used, allows the spacings and offset between the conductors in the two arrays to be visually examined from the upper side of the fabricated cable, as a result of an illuminated light source 44a being directed against the cable from the underside thereof.

As for the printer 44, when used, it may also be of a conventional type. As shown, it is positioned to operate opposite an associated idler roller 93.

Attention will now be directed to a typical flat cable laminating operation to fabricate one preferred embodiment of the cable 10. Initially, the two outer plastic films 18, 19, each having a flame retardant polyester adhesive coating 21 or 22 on the inner-facing side thereof, are respectively advanced from the supply reels 56, 57, together with the two arrays of conductors 13, 14 from the supply reels 47, 48, and the non-adhesive backed center plastic film 16. Also advanced with the center film 16 are the upper and lower spaced arrays of isolating strips 28 and 29, preferably previously bonded to the center film while in roll stock form in accordance with an aspect of the invention. During such advancement of the composite cable elements, not only the non-adhesive coated side of the upper film 18, but the upper array of conductors 13 are preferably brought into contact with and pre-heated by the arcuate surface 34b of the heated shoe 34, immediately prior to their being fed through the nip of the laminating rollers. Such preheating has been found to facilitate the reliable bonding of not only the conductor array 13 to the upper film 18, but the latter to the center film 16 during the laminating operation. The need for such selective pre-heating is believed due to the fact that the outer rubber layer 68 on the upper roller 31 is not nearly as efficient in conducting, retaining and supplying heat as the lower steel roller 32, even though the heated shoe 34 is also employed to externally heat a portion of the peripheral resilient surface of the roller 31.

In this connection, it should be readily apparent, however, that both arrays of conductors could be preheated by similar means, or selectively preheated by other means, such as by the use of one or more internally heated rollers comprising part of the conductor tensioning and guide roller assemblies 51 and 52, and/or by the use of separate heating ovens (not shown). Likewise, not only the center film 16, but the films 18 and 19 could likewise be selectively pre-heated, if desired, by similar or other means, such as by independent heating ovens, one such optional oven 94 being shown in phantom in FIG. 6. for the particular cable of concern herein, however, it has been found to be not only advantageous, but very important, to utilize only the uniquely heated laminating rollers 31, 32 and heated shoe 34, in conjunction with the aforementioned preferred temperatures, pressures and feed rates associated therewith, to effect the bond strengths, as well as conductor spacing uniformity, desired in the fabricated cable. In regard to the two outer films 18, 19, it should also be appreciated that the adhesive coatings 21, 22 thereon could be applied, such as in liquid form, with conventional applicators immediately before those films were advanced through the nip of the laminating rollers. The present method and apparatus, however, is believed to afford greater simplicity and control over the cable laminating operation.

Regardless of how the adhesive coatings 21, 22 are applied to the outer films 18, 19, it is preferable to fabricate the cable with the width of the center film 16 initially being slightly wider than that of the outer films. As such, the mutually disposed borders of the center film, as laminated, will effectively mask the longitudinally disposed edges of the outer films from the otherwise immediately adjacent peripheral surface portions of the rollers 31, 32, thus preventing the latter from coming in contact with any adhesive that may tend to seep out of the outer film-center film border interfaces during the laminating operation.

FIG. 7, taken along the line 7—7 in FIG. 6 as previously noted, depicts the cross-section of the various cable elements at a point of maximum bonding force exerted thereagainst when confined between the nip of the laminating rollers 31, 32. It is seen that the adhesive coatings 21, 22 on the outer films 18, 19, while heated to a very soft state, are forced by the rollers 31, 32 to flow into and substantially completely fill the otherwise established voids defined between the edges of each conductor in each array and the desired longitudinally disposed regions of contact between the associated outer and center films. Such fillet-shaped areas filled with adhesive, together with some seepage of the adhesive between the conductors and the center film, result in the firm bonding of the conductors to the latter film as well as to the associated outer film, except in the regions of the isolating strips.

It is also seen that the resilient peripheral surface 68 of the upper laminating roller 31 advantageously essentially acquires the same peripheral surface profile as the lower steel roller 32, notwithstanding the fact that only the latter roller is formed with the conductor-receiving grooves 72 in the periphery thereof. It should be appreciated that it is the combination of a smooth-surfaced resilient roller and a groove-surfaced steel roller, together with a specially configured heated shoe, that makes possible the attainment of high bond strength between films, while simultaneously affording precise control over the critical conductor spacings and offset, particularly with respect to the latter when the center film of the cable is non-adhesive backed.

After passing through the nip of the laminating rollers 31, 32, the then completely fabricated cable 10, with the adhesive coatings still in a very soft state, are preferably drawn through nip defined between the aforementioned unheated, and resilient finishing rollers 37, 38. These rollers insure that the composite cable elements remain in precise, laminated relationship until the adhesive coatings have sufficiently solidified. As previously noted, the rollers 37, 38 also tend to reduce the tensile forces otherwise exerted on the three films by the laminating rollers 31, 32, and further tend to smooth out any air pockets and eliminate any possible voids that may possibly still exist in the cable after having passed through the nip of the laminating rollers. Such voids or air pockets could possibly prove particularly troublesome in a given telephone under-carpet cable wiring installation, for example, should they occur at points where the cable is folded back upon itself to effect bends, or occur in regions near the terminating end of a cable, where moisture or foreign contaminant problems could develop between the center film and a given one of the outer films, in the vicinity of one or more conductors of the cable. In addition, air pockets or voids can adversely affect the electrical characteristics of the cables because of the significant difference in air versus adhesive dielectric constants.

After the completely fabricated cable 10 passes through the nip of the rollers 37, 38, the cable 10 is trimmed to the desired finished width by the slitter 41, before passing by and in contact with the aforementioned optical counter 43, light box conductor gauging platform 44 and printer 46, and then before being wound upon the take-up reel 54.

By way of further specific example with respect to the operating parameters employed in using the apparatus 30 of FIG. 6 to fabricate one preferred embodiment of the cable 10, having the specific structural dimensions set forth above in connection with a description of the cable per se, the peripheral steel surfaces of the laminating rollers were both preferably heated to a temperature of approximately 390° F., as were the arcuate surfaces 34a and b of the shoe 34, with the peripheral surface of the rubber layer 68 on the roller 31 acquiring a temperature of approximately 320° F. When utilizing a rubber layer 68 on the laminating roller 31 measuring approximately 0.75 inch in thickness, the compressive laminating force exerted on the cable in passing through the nip thereof measured approximately 300 psi. With the rollers 37 and 38 having similarly dimensioned rubber layers 37a, 38a, a compressive force exerted on the fabricated cable in passing through the nip thereof measured approximately 300 psi. The feed rate in this specific operating example was approximately 6 ft. per minute.

As thus fabricated, the one preferred illustrative cable embodiment 10, with 25 pairs of conductors, as previously mentioned, exhibited crosstalk loss in excess of 110 db for lengths up to 35 ft., and excellent bond strengths between adjacent laminated films, as evidenced by a peel force in excess of 8 pounds per inch. It should be understood, of course, that the exceptionally high crosstalk loss experienced in the cable 10 was also only made possible by the unique construction thereof, in conjunction with the method and apparatus for its manufacture.

With respect to the connectorization of the completely fabricated cable 10, as previously briefly described, terminating end sections 18a, 19a of the outer films, shown in phantom only in FIG. 8, can be readily abraided away so as to thereafter facilitate the separation of the conductor ends 13a, 14a from the bare center film 16. This allows the conductor ends to be suitably connected to a connector of either the solder or solderless type, the aforementioned illustrative connector 25 depicted in FIG. 3 being of the former type, having U-shaped conductor-receiving solder cups 25a.

As also previously mentioned, prior to the present invention it was quite difficult and time consuming to strip the otherwise bare conductor ends 13a, 14a from the center film 16, because of not only the adhesive backing on the latter film, but because of the adhesive coatings from both the center and outer films filling the fillet-shaped voids, defined between the edges of adjacent conductors in each array. Even when the center film 16 is bare, in accordance with an aspect of the present invention, the outer film coatings 21,22 also substantially completely fill the voids adjacent the edges of the conductors, as desired for cable integrity, as best seen in FIGS. 1 and 7. Such desired adhesive-filled areas, together with some seepage of such adhesive between the underside of the conductors and the center film, results in the conductors remaining substantially secured to the center film 16, as well as to the associated outer film, if it were not for the uniquely positioned isolating strips 28,29 described briefly hereinabove.

Considering the significance of the isolating strips 28,29 now in greater detail, each spaced array thereof is preferably bonded, or otherwise secured, to each side of the center film 16 so as to extend transversely thereacross in aligned pairs, as best seen in FIGS. 1-3 and 8-12. These isolating strips are located, as previously mentioned, at predetermined possible spaced cable termination points, for example, at 5, 10 or 15 foot intervals.

The isolating strips 28, 29 may be of any suitable non-conductive material that bonds firmly, lightly, or not at all to the outer films 18, 19 and to the center film, selectively, thus allowing the terminating ends of the conductors 13a, 14a, as seen in FIGS. 8-10, for example, to be selectively stripped from the isolating strips, or from the associated outer films, or both, as desired or required to facilitate connectorization to either solder or solderless type connectors.

In those situations where it is desired that the conductor ends be freely separated from the isolating strips, it is apparent that the latter may either remain secured to the center film 16, or be peeled therefrom. This will depend on the degree of adherence established therebetween, which adherence can be readily controlled not only by the proper selection of the isolating strip and adhesive backing materials, but by the bonding pressures and/or temperatures employed both at the time of initial securement of the isolating strips to the center film, and at the time of cable fabrication.

By way of further example, when the center and outer films are of Mylar plastic film, and the adhesive coatings on the outer films are of a polyester composition, isolating strips of Teflon plastic, having an adhesive backing, such as of polyester, on only the side thereof which faces the center film 16, will not bond or even lightly adhere to the associated outer film 18 or 19, or to the associated array of conductors. Depending on the nature of the adhesive backing, such Teflon plastic isolating strips may be either lightly or permanently bonded to the center film. Alternatively, the isolating strips 28, 29 may be of polyester plastic, with the adhesive backing thereon chosen of a material that will result in the isolating strips adhering much more firmly to the respectively associated outer films than to the center film.

In addition to the aforementioned isolating strip materials, it should be appreciated, of course, that such strips may be made out of many other materials not necessarily of a plastic composition, to provide the same desired functional results. For example, such isolating strips may also be made out of certain types of non-conductive fibrous material, rubber or paper when treated, as required, to be flame retardant.

The width of the isolating strips 28, 29 may be chosen such that they either substantially coincide with the longitudinally disposed terminating portions 18a, 19a of the outer films normally removed from the cable for connectorization, or allow for a rearward portion remaining anchored between the outer and center films, as desired. The latter type of cable termination would be most practical, of course, if the isolating strips are at least lightly bonded to the outer films, as well as to the center film, as is represented in the illustrative embodiment of FIG. 9.

In any event, it may often be desired or necessary to trim back an end portion of the exposed center film 16, together with all, or the co-extensive forward end portion, of the isolating strips 28, 29 secured thereto, so as to more completely free the exposed conductor ends 13a, 14a for connectorization to a conventional connector of either the solder or solderless type, the former type being illustrated in FIG. 3. In FIG. 8, the dashed line 96 represents the point to which the center film and isolating strips would be trimmed back for connectorization in FIG. 3.

As for positioning the isolating strips 28, 29 at the desired spaced terminating points along the cable, it should be understood that they may be either permanently or temporarily secured to the center film 16 either manually or in an automated manner, and as an independent operation, so as to be a part of the film 16 when used in roll stock form, as described in connection with the operation of the apparatus 30 of FIG. 6. Alternatively, the isolating strips may be positioned manually or in an automated manner, on opposite sides of the center film 16, just prior to the latter being fed through the nip of the laminating rollers 31, 32, together with the outer films 18, 19 and the two interleaved arrays of conductors 13, 14. In this latter case, as well as in the former case, the isolating strips 28, 29 need not be of a material that would even lightly adhere to the center film 16, as long as the strips were properly aligned and positioned laterally relative to the center film, and with each lower isolating strip 29 being suitably maintained in proper registry with the respectively associated upper strip 28 prior to, and during passage of, the films, conductors, and strips through the nip of the laminating rollers.

This could be effected, for example, by employing isolating strips dimensioned to extend a short distance beyond the opposite edges of the finished cable, and of a type capable of being temporarily lightly bonded or otherwise secured at their common mating ends so that each pair of aligned strips would remain in proper registry during the cable laminating operation. It is generally desired, however, that the isolating strips be dimensioned such that the laterally disposed ends thereof either conicide with, or are confined within, the respective marginal edges of the finished cable. In the latter case, any given pair of isolating strips that were not used to terminate the cable would remain hermetically sealed between the inner and outer laminated films.

It will also be appreciated, of course, that when the isolating strips 28, 29 are positioned across the width dimension of the center film 16 just prior to the cable laminating operation, this advantageously allows the strips and, hence, the thus defined terminating regions along the faricated cable, to be located at any desired or variably spaced intervals, as in contrast to fixed predetermined intervals when the strips form a part of the center film as used in roll stock form. In this connection, it should also be noted that the strips could take the form of suitable coatings, such as of non-adhering resinous material applied to the center film "on the fly", such as by a spraying or brushing operation.

From the foregoing, it is seen that depending on the nature of the isolating strips 28, 29, and how they are positioned and secured within the cable 10, a number of different unique cable terminations may be effected which, in turn, are selectively conducive to effecting different types of cable connectorization, as will now be described in greater detail with respect to FIGS. 9–12.

In these last mentioned FIGS., like, but primed, reference numerals will be used to identify corresponding structural elements of the basically common fabricated cable 10.

With specific reference now to FIG. 9, the terminated end of a cable 10' includes a pair of isolating strips 28', 29' that may be of a material, or have an adhesive backing, of the type that will permanently bond to the outer terminated film ends 18a', 19a', and associated conductor ends 13a', 14a', but not to the center film end portion 16a'. Such isolating strips are seen to allow the terminated conductor ends 13a', 14a' to be readily separated from the center film, if desired, while remaining hermetically sealed between the respectively associated and co-extensive portions of the outer films and isolating strips. For this purpose, it may be desirable that the isolating strips be adapted to at least lightly bond to the center film 16', so as to also provide an effective hermetic seal for the conductors near the rearward edges of the isolating strips, as illustrated. Such a terminated cable is particularly adapted for connectorization to solderless type connectors, i.e., of the insulation displacement type. Isolating strips made of polyester plastic, with properly chosen adhesive backings, such as of polyester or acrylic compositions, are particularly advantageous for this purpose. The leading end portions 16a' of the center film 16' would normally be trimmed back, such as to the point indicated by the dashed line 97.

FIG. 10 illustrates the terminated end of a flat cable 10'', similar to that of FIG. 9, but distinguishing therefrom by having outer terminated portions 18a'' and 19a'' of the outer films removed by any suitable means so as to expose the outer surfaces of the conductor ends 13a'', 14a'' for connectorization to either a solder or solderless type connector. In effecting such a connectorization, the exposed center film end portion 16a'' would normally be trimmed back, such as to the point indicated by the dashed line 98, unless the terminated end of the cable was to be used as a male type member for insertion within a female type connector.

FIG. 11 illustrates the terminated end of a flat cable 10''' wherein four isolating strips are employed, one pair 28''', 29''' being respectively bonded to opposite sides of the center film end portion 16a''', as in FIG. 8, with each of a second pair 101, 103 being initially bonded between the associated outer film end portion 18a''' (or 19a''') and the associated conductor ends 13a''' (or 14a'''). As illustrated, the strips 101, 103, together with the co-extensive film portions 18a''', 19a''', have been peeled from the associated conductors, with such peeled sections thus being in positions to be severed from the cable, if desired.

Depending on the bonding characteristics of the four isolating strips, the terminating ends of each array of conductors may advantageously either be manually separated from the contacting isolating strips, as illustrated, or such conductor ends may remain hermetically sealed between such isolating strips while either positioned adjacent to, or separated from, the center film, as required for a particular type of cable connectorization. In the former illustrated case, of course, no time-consuming mechanical or chemical operation is required to remove the terminating end portions of the outer films for connectorization. Obviating the need for a mechanical abraiding operation, in particular, also eliminates problems that can otherwise possibly arise, such as with respect to foreign debris, and/or physical damage to the conductor ends when of fragile and minute size. As in the case of the embodiment of FIG. 8, the exposed forward end portion 16a''' of the center film, and major forward portions of the isolating strips 28''', 29''' would normally be trimmed back, such as to the dashed line 106, unless the terminated cable end was to be used as a male type member for insertion within a female type connector.

In the final illustrative embodiment of the invention, a terminated end of a cable 10'''' is shown, which end includes a pair of isolating strips 28'''', 29'''', similar to those used in the terminated cable of FIG. 10, but distinguishing therefrom by also using an auxiliary non-conductive spacing member 108. The latter member is secured to opposite sides of the exposed end portion 16a'''' of the center film, after termination of the cable. Such a spacer member provides greater dielectric material separation between the two arrays of conductor ends 13a'''', 14a'''', particularly if they are again compressed against the spacing member 108, through the interposed isolating strips, so as to form a male-type member adapted for insertion in a female type connector (not shown). In the latter case, the increased separation established between the two arrays of conductor ends at the point of termination, because of the presence of the auxiliary spacer member 108, would normally satisfy even the most stringent d-c voltage breakdown requirements specified in most, if not all, demanding telephone system wiring applications.

While the spacer member 108 is depicted as a U-shaped strip of material, it is apparent that such a member could actually comprise a second pair of isolating strips bonded, or otherwise secured, to the center film end portion 16a'''' either at the time of cable termination, or during the manufacture of the cable, as in the case with the cable embodiment of FIG. 11.

With respect to cable termination of the types depicted in FIGS. 8, 10 and 12, where it is normally desired to remove the terminating end portions 18a, 19a of the outer films from the cable for connectorization, it should be understood that the cable can be initially severed at a number of different points relative to a pair of isolating strips 28, 29, to accomplish this result. More specifically, by severing the cable at a point that bisects a pair of isolating strips, the terminating end portions 18a, 19a of the outer films may then be removed, such as by longitudinally directed displacement of a grinding apparatus, for example, relative to the terminated cable, along at least the co-extensive regions of each remaining half of the original full width pair of isolating strips. This advantageously allows two cable terminations to be made for each original pair of isolating strips.

Alternatively, the cable could initially be severed a short distance in front of the laterally disposed forward edges of a pair of isolating strips 28, 29. The cable could then be readily clamped between the severed end and a region rearward of a pair of isolating strips so as to allow the outer terminating film portions 18a, 19a to be removed, with the ultimately exposed arrays of conductors being more firmly positioned over the lengths thereof that are co-extensive with an adjacent isolating strip. In this latter case, the initially severed and normally clamped end of the cable would normally be trimmed back to the laterally disposed forward edges of the then exposed pair of isolating strips.

While several related and preferred flat cable embodiments, as well as apparatus and methods for manufacturing and connectorizing same, have been disclosed herein, it is obvious that various modifications may be made to the present illustrative embodiments and methods of the invention, and that a number of alternative related embodiments and methods could be devised by one skilled in the art without departing from the spirit and scope of the invention.

What is claimed is:

1. A flat cable comprised of:
   at least two conductor arrays, with the conductors in one array being slightly offset by a predetermined amount from the respectively associated conductors in the other array;
   an initially bare center insulative plastic film, of the type that will not adhere to said conductors, interposed between said conductor arrays, and
   two outer insulative plastic films, each having an adhesive backing on the side thereof which faces a different one of said two conductor arrays, and being dimensioned to extend coextensively with said center film, each of said outer films, through said adhesive backing thereon, being bonded to both the adjacent surfaces of the associated array of conductors and to the adjacent longitudinally disposed surface regions of said center film defined both between adjacent conductors, and along border regions on opposite sides of the array thereof, said conductors in each array thus being permanently positioned and encapsulated between said center film and the associated one of said outer films.

2. A flat cable in accordance with claim 1, further comprising a plurality of isolating strips of non-conductive material located at predetermined spaced termination points along said cable, said isolating strips being oriented transversely, and on opposite sides, of said center film in aligned pairs such that each isolating strip is interposed between said center film and an associated one of said two arrays of conductors.

3. A flat cable in accordance with claim 1, wherein said conductors are of rectangular cross-section and said center film is of a bare polyester plastic material.

4. A flat cable in accordance with claim 3, wherein said center and outer films are of polyethylene terephthalate plastic, with each of said outer films having a flame retardant, heat-activated polyester adhesive coating on the side thereof facing said center film in the fabricated cable.

5. A flat cable in accordance with claim 3, wherein said center insulative film has a thickness of approximately 0.005 inch, wherein each of said outer insulative films has a thickness of approximately 0.003 inch, and wherein said adhesive coating on the one inner facing side of each of said outer films has an initial thickness of approximately 0.003 inch.

6. A flat cable in accordance with claim 5, wherein said conductors have a thickness of approximately 0.006 inch, and a width of approximately 0.03, inch, and wherein the center line-to-center line spacing between adjacent conductors in the same array is maintained at a nominal distance of 0.085 inch, ±0.005 inch, and wherein said offset spacing between the respectively associated conductors forming pairs in said two arrays is maintained at a nominal distance of 0.010 inch, ±0.002 inch.

7. A flat cable in accordance with claim 4, wherein the offset spacing between the respectively associated conductors in said two arrays thereof is in a range of 0.007 to 0.014 inch.

8. A flat cable in accordance with claim 7, wherein said conductors are of annealed copper having a thickness in the range of 0.003 to 0.008 inch, and a width in the range of 0.025 to 0.040 inch, with the major surfaces of said conductors being oriented in the major plane of said cable, and wherein the center line-to-center line spacing between adjacent conductors in the same array is within a range of 0.080 to 0.090 inch.

9. A flat cable in accordance with claim 8, wherein said center insulative film has a thickness in the range of 0.002 to 0.008 inch, wherein said outer insulative films each has a thickness in the range of 0.002 to 0.005 inch, and wherein the adhesive coating on the one side of each outer film has an initial thickness in the range of 0.001 to 0.005 inch.

10. A flat cable in accordance with claim 7, wherein said center insulative film has a thickness of approximately 0.005 inch, wherein each of said outer insulative films has a thickness of approximately 0.003 inch, and wherein said adhesive coating on the one inner facing side of each of said outer films has an initial thickness of approximately 0.003 inch.

11. A flat cable in accordance with claim 7, wherein said conductors have a thickness of approximately 0.006 inch and a width of approximately 0.033 inch, and wherein the center line-to-center line spacing between adjacent conductors in the same array is maintained at a nominal distance of 0.085 inch, and wherein said offset spacing between the respectively associated conductors forming pairs in said two arrays is maintained at a nominal distance of 0.010 inch.

12. A flat cable in accordance with claim 1, further comprising a plurality of non-conductive isolating strips positioned at predetermined spaced termination points along said cable, said isolating strips being positioned transversely, and on opposite sides, of said center film in aligned pairs such that each isolating strip is interposed between said center film and an associated one of said two arrays of conductors.

13. A flat cable in accordance with claim 12, wherein said isolating strips comprise thin plastic tapes.

14. A flat cable in accordance with claim 13, wherein said isolating strips are of a type adapted to at least lightly bond to said center film, but not to said conductors, thus facilitating the separation of the coextensive end portions of the associated array of contacting conductors therefrom.

15. A flat cable in accordance with claim 14, wherein said isolating strips are of a type adapted to adhere more firmly to the respectively adjacent ones of said outer films than to said center film, each of said isolating strips thus being readily separable from said center film with the associated array of conductor end portions remaining, accurately positioned and firmly bonded between the associated isolating strip and that portion of the adjacent outer film coextensive therewith, the resultant separated arrays of conductor ends thus allowing the connectorization of the cable to a connector such as of the insulation displacement type.

16. A flat cable in accordance with claim 9, further comprising a plurality of non-conductive isolating strips positioned at predetermined spaced termination points along said cable, said isolating strips being positioned transversely, and on opposite sides, of said center film in aligned pairs such that each isolating strip is interposed between said center film and an associated one of said two arrays of conductors.

17. A flat cable in accordance with claim 15, further comprising:
a second pair of isolating strips located at each cable termination point and aligned with said first pair, each isolating strip of said second pair being interposed between a different one of said arrays of conductors and the outer film immediately adjacent thereto, said second pair of isolating strips being of a material that will not firmly bond to said associated outer film nor to said array of contacting conductors, thus allowing the conductor ends of each array as thus interposed between and coextensive with two aligned and different isolating strips from said first and second pairs to be readily separated therefrom so as to allow the connectorization of said cable.

18. A flat cable in accordance with claim 15, wherein non-conductive auxiliary spacer means is secured to opposite sides of the exposed end of said center film after said isolating strips have been separated therefrom, together with the respectively associated arrays of conductors, said spacer means allowing a greater insulative dielectric material separation between said two arrays of conductors at the point of cable termination in situations when said isolating strips, together with the associated arrays of conductors bonded thereto, are to be subsequently brought into engagement with said spacer means so as to facilitate connectorization of the terminated cable within a female-type connector.

19. A flat cable, which comprises:
a pair of spaced, planar arrays of parallel flat conductors;
a first common layer of an insulative material interposed between the arrays of parallel conductors, and having longitudinally disposed border regions that laterally extend beyond the edges of the two arrays of conductors;
a second layer of insulative material positioned to cover one of said two arrays of parallel conductors, and having longitudinally disposed border regions that are respectively coextensive with the border regions of said first layer, said second layer of insulative material having an adhesive coating on the inner side thereof, in the fabricated cable, for bonding one array of conductors to said second layer, and for bonding the immediately adjacent and longitudinally disposed interfacing regions of said second layer to said first layer, and
a third layer of insulative material positioned to cover the other of said two arrays of parallel conductors, and having longitudinally disposed border regions that are respectively coextensive with the border regions of said first layer, said third layer of insulative material having an adhesive coating on the inner side thereof, in the fabricated cable, for bonding said other array of conductors to said third layer, and for bonding the immediately adjacent and longitudinally disposed interfacing regions of said third layer to said first layer.

20. A flat cable in accordance with claim 19, wherein each of said first, second and third insulative layers is comprised of a polyethylene terephthalate plastic film, with said second and third films each having a flame retardant, heat-activated adhesive coating on the side thereof facing said first film.

21. A flat cable in accordance with claim 20, wherein said conductors are of rectangular cross section, having a thickness in the range of 0.003 to 0.008 inch, and a width in the range of 0.025 to 0.040 inch, and wherein the conductors in one array are respectively associated with those in the other array to define pairs, with the conductors of each pair being laterally offset by a predetermined distance, and with the center line-to-center line spacing between conductors in the same array being in a range of 0.080 to 0.090 inch.

22. A flat cable in accordance with claim 21, wherein said first film has a thickness in the range of 0.002 to 0.008 inch, wherein said second and third films each have a thickness in the range of 0.002 to 0.005 inch, and wherein said adhesive coatings each have a thickness in the range of 0.001 to 0.005 inch.

23. A flat cable in accordance with claim 19, further comprising a plurality of thin, non-conductive isolating plastic members positioned at predetermined spaced termination points along said cable, said isolating members being positioned transversely, and on opposite sides, of said first layer in aligned pairs such that each isolating member is interposed between said first layer and an associated one of said two arrays of conductors.

24. A flat cable in accordance with claim 22, further comprising a plurality of thin, non-conductive isolating strips positioned at predetermined spaced termination points along said cable, said isolating strips being positioned transversely, and on opposite sides, of said first film in aligned pairs such that each isolating strip is interposed between said first film and an associated one of said two arrays of conductors, said isolating strips further being of a type whereby one major surface thereof will at least lightly adhere to said first film, while an opposite major surface thereof will allow the associated array of conductors to be readily separated therefrom.

25. A flat cable in accordance with claim 19, wherein the conductors in said two arrays are precisely positioned relative to each other such that each two adjacent pairs of conductors are arranged in a geometric configuration along their entire length in accordance with the relationship $d_{13} d_{24} = d_{14} d_{23}$, where subscripts 1 and 2 represent the conductors of one of each two successively adjacent conductor pairs, and the subscripts 3 and 4 represent the conductors of the other of each two successively adjacent conductor pairs.

26. A flat cable in accordance with claim 25, wherein adjacent pairs of said conductors are arranged in a particular parallelogram configuration, as viewed in the cable cross section, the particular parallelogram being of a family thereof satisfying $d_{13} d_{24} = d_{14} d_{23}$, and further defined by the relationship $X = (2 \cos 2\alpha)^{\frac{1}{2}}$, where $\alpha$ is the angle between sides of the parallelogram, and $X = 2b/a$, where 2 b is the length of each side of one pair of parallel sides and a is the length of each side of the other pair of parallel sides.

27. A multi-conductor flat cable comprised of:
a bare insulative center film;
two arrays of parallel extending conductors, each array being positioned on a different side of said center film, with the conductors in said two arrays being precisely positioned relative to each other such that each two adjacent pairs of conductors are arranged in a geometric configuration along their entire length in accordance with the relationship $d_{13} d_{24} = d_{14} d_{23}$, where subscripts 1 and 2 represent the conductors of one of each two successively adjacent conductor pairs, and the subscripts 3 and 4 represent the conductors of the other of each two successively adjacent conductor pairs, and
two outer insulative films, each having an adhesive backing on the side thereof which faces a different one of said two conductor arrays, and being dimensioned to extend coextensively with said center film, each of said outer films, through said adhesive backing thereon, being bonded to both the adjacent surfaces of the associated array of conductors and to the longitudinally disposed and coextensive interfacing regions of said center film, said conductors in each array thus being permanently bonded and encapsulated between said center film and the associated one of said outer films.

28. A multi-conductor flat cable in accordance with claim 27, wherein adjacent pairs of said conductors are arranged in a particular parallelogram configuration, as viewed in the cable cross section, the particular parallelogram being of a family thereof satisfying $d_{13} d_{24} = d_{14} d_{23}$, and further defined by the relationship $X = (2 \cos 2\alpha)^{\frac{1}{2}}$, where $\alpha$ is the angle between sides of the parallelogram, and $X = 2b/a$, where 2b is the length of each side of one pair of parallel sides and a is the length of each side of the other pair of parallel sides.

29. A multi-conductor flat cable in accordance with claim 28, wherein said conductors are of rectangular cross section, said center film is of bare polyester plastic material, having a thickness in the range of 0.002 to 0.008 inch, and wherein the respectively associated conductors of each formed pair in said cable are offset from each other by a distance in the range of 0.007 to 0.014 inch.

30. A multi-conductor flat cable in accordance with claim 29, further including:
a plurality of non-conductive isolating strips positioned at predetermined spaced termination points along said cable, said isolating strips being positioned transversely, and on opposite sides, of said center film in aligned pairs such that each isolating strip is interposed between said center film and an associated one of said two arrays of conductors.

31. A multi-conductor flat cable in accordance with claim 30, wherein said isolating strips are of a type adapted to at least slightly bond to only said center film, but not said conductors, thus facilitating the separation of the co-extensive end portions of the associated array of contacting conductors therefrom.

* * * * *